United States Patent [19]

Ko et al.

[11] Patent Number: 5,350,707

[45] Date of Patent: Sep. 27, 1994

[54] METHOD FOR MAKING A CAPACITOR HAVING AN ELECTRODE SURFACE WITH A PLURALITY OF TRENCHES FORMED THEREIN

[75] Inventors: Jaehong Ko; Sungtae Kim, both of Seoul; Hyunbo Shin; Seonghun Kang, both of Suwon, all of Rep. of Korea

[73] Assignee: Samsung Electronics Co., Ltd., Kyungki-do, Rep. of Korea

[21] Appl. No.: 974,735

[22] Filed: Nov. 13, 1992

[30] Foreign Application Priority Data

Nov. 19, 1991 [KR] Rep. of Korea ............... 91-20618
Jan. 8, 1992 [KR] Rep. of Korea ............... 92-156
Jan. 8, 1992 [KR] Rep. of Korea ............... 92-158

[51] Int. Cl.$^5$ .................. H01L 21/70; H01L 27/00
[52] U.S. Cl. ......................... 437/52; 437/60; 437/919
[58] Field of Search ............. 437/52, 60, 47, 919

[56] References Cited

U.S. PATENT DOCUMENTS

| 5,149,676 | 9/1992 | Kim | 437/228 |
| 5,204,280 | 4/1993 | Dhong et al. | 437/52 |
| 5,223,448 | 6/1993 | Su | 437/47 |
| 5,227,322 | 7/1993 | Ko et al. | 437/47 |
| 5,256,587 | 10/1993 | Jun et al. | 437/52 |

FOREIGN PATENT DOCUMENTS 92-310476.4  3/1993  European Pat. Off. .
3101261  4/1991  Japan .

OTHER PUBLICATIONS

Fabrication of Storage Capacitance-Enhanced Capacitors with a Rough Electrode Hayashide et al., Extended Abst. 22nd. Int'l Conf. Solid State Devices and Mat'l, Japan J. Appl. Phys., Tokyo, Japan (1990), pp. 869-872.

Primary Examiner—Olik Chaudhuri
Assistant Examiner—H. Jey Tsai
Attorney, Agent, or Firm—Robert A. Westerlund; Stephen R. Whitt; Charles R. Donohoe

[57] ABSTRACT

The present invention provides a semiconductor device having a capacitor that is formed through: a first step of forming a polysilicon layer having a rough surface after a nonconductive layer is applied to a base substrate; a second step of etching back away the polysilicon layer to expose the nonconductive layer and thus remaining islandlike polysilicon layers; a third step of etching the nonconductive layer, using the remained polysilicon layers as an etching mask; a fourth step of etching the base substrate of the capacitor, using the nonconductive layer as a mask; a fifth step of forming a pattern of the base substrate of the capacitor after the removal of the remained nonconductive layer; a sixth step of forming an upper substrate of the capacitor after the formation of a dielectric film of the capacitor. According to this invention, the surface area of the capacitor electrode is remarkably enhanced such that the integrity of DRAMs is more improved.

8 Claims, 10 Drawing Sheets

METHOD FOR MAKING A CAPACITOR HAVING AN ELECTRODE SURFACE WITH A PLURALITY OF TRENCHES FORMED THEREIN

BACKGROUND OF THE INVENTION (1) Field of the Invention

The present invention relates generally to a capacitor and a method for making a capacitor. More particularly, this invention relates to a capacitor having a conductive layer with a plurality of microscopic trenchlike sections and a relatively simple method for making a capacitor having an increased capacitance.

(2) Description of the Prior Art

Remarkable progress has been made in the manufacture of Dynamic Random Access Memories (DRAM) using high integration technology. Accordingly, as a semiconductor device has a small size and the problem of securing a high capacitance becomes an issue. For example, main stream production has changed from 1 Mbit DRAMs to 4 M bit DRAMs has been achieved.

In such a DRAM with high integration, a predetermined capacitance of the cell storage capacitor must be kept constant, in spite of the decrease in the area of the cells. For example, each area of a cell and a capacitor in a 64 M bit DRAM decreases to about 0.8 $\mu m^2$ and 1.0 $\mu m^2$.

In the case where the areas of charge storage capacitors are also decreased and the capacitance becomes small, a soft error occurs on exposure to $\alpha$-light, and the problem of reliability on a semiconductor device becomes an issue, too. Accordingly, the capacitance of cell storage capacitors must be kept constant, in spite of the decrease in the areas of the capacitors, in order to obtain an improved integration of a semiconductor device.

In a recent DRAM whose cells are based on transistor-stacked capacitor combinations, one of a pair of electrodes of a storage capacitor has been formed to have a three-dimensional structure. This makes the capacitance larger by 30 to 40% than that of a two-dimensional storage capacitor having the same size as the three-dimensional one. In the case of 64 M bit DRAMs having high integration, the capacitance needs to increase without the increase of cell areas or storage area, and various three-dimensional structures or high dielectric constant have been studied. One of technologies for increasing the capacitance of a storage electrode without the increase of cell areas or storage area is producing high-performance capacitors with a rough surface polysilicon film as a storage electrode.

A method for obtaining a high capacitance in defined small areas of capacitors, such as the above three-dimensional DRAMs, is described in "Solid state Device & Material No 90-167" page 49, published December 1990.

As a prior art, FIG. 1 shows a sectional view of the structure of a capacitor formed with a polycrystalline silicon film having a rough surface. A storage electrode 11 that serves as a first electrode of the capacitor, e.g. a first polycrystalline silicon film is deposited at 550° C. At these temperatures, amorphous and polycrystalline structures coexist, and the surface areas of silicon grains having a hemispherical shape are maximized. Consequently the surface morphology strongly depends on the deposition temperature. In the surface area increase on 550° C. deposited film, the area of the surface covered with hemispheres is about twice as large as that of the flat surface. After that, first electrodes are defined using conventional photolithography and etching technique. A capacitor dielectric film 12 of oxide film/nitride film is applied thereon, and a plate electrode 13 that becomes a second electrode, i.e. a polycrystalline silicon is deposited.

In the above method, however, since close attention to the control of temperatures should be paid and the polysilicon film has hemispherical grains, there is a limit on the increase of capacitance.

SUMMARY OF THE INVENTION

Accordingly, it is an object of the present invention to increase the capacitance of a capacitor.

It is another object of the invention to provide a capacitor having capacitance and a manufacturing technique for the capacitor, by including an electrode substrate of a plurality of microscopic trenchlike sections.

In order to achieve the above objects, a capacitor of the present invention comprises a first conductive layer having a plurality of microscopic trenchlike sections, a dielectric film formed along the trenchlike sections, and a second conductive layer formed over the dielectric film.

A method for making the capacitor comprises a first step of forming a first conductive layer having a rough surface after a nonconductive layer is applied to a base substrate; a second step of etching back away the polysilicon layer to expose the nonconductive layer and thus remaining islandlike polysilicon layers; a third step of etching the nonconductive layer, using the remained polysilicon layers as an etching mask; a fourth step of etching the fist conductive layer of the capacitor, using the nonconductive layer as a mask; a fifth step of forming a pattern of the first conductive layer of the capacitor after the removal of the remained nonconductive layer; a sixth step of forming a second conductive layer of the capacitor after the formation of a dielectric film of the capacitor. If the first conductive layer is deposited to be islandlike, the second step is not necessary.

Furthermore, the present invention discloses a method for making the capacitor comprising the steps of:

forming a first conductive layer, a nonconductive layer and a second conductive layer having a rough surface in serial order;

etching back away the second conductive layer having a rough surface;

etching the nonconductive layer, using islandlike second conductive layers formed by the etch back process as an etching mask;

etching the first conductive layer, using the nonconductive layer as an etching mask;

removing the nonconductive layer used as a mask and forming the base substrate to have trenchlike sections;

forming a dielectric film on the first conductive layer; and forming a second conductive layer on the dielectric film.

The present invention provides another method for making a capacitor comprising the steps of:

forming and patterning a first conductive layer, forming a first oxide film thereon, and then forming a silicon nitride film thereon;

forming a second oxide film by oxidizing the silicon nitride film;

etching a second oxide film to expose the first conductive layer;

forming a plurality of microscopic trenches by etching the first conductive substrate, using the silicon nitride as a mask;

removing the silicon nitride film and oxide film; and forming a dielectric film along the surface of the first conductive layer and forming a second conductive layer thereon.

BRIEF DESCRIPTION OF THE DRAWINGS

The above and further objects, features and advantages of the present invention will become more apparent from the following detailed description of embodiments taken in conjunction with the accompanying drawings.

FIGS. 4D' to 4F' depict partially the steps in the manufacture of a capacitor including an electrode substrate of a plurality of microscopic trenchlike sections in accordance with a third preferred embodiment of this invention;

FIGS. 5E' to 5G' depict partially the steps in the manufacture of a DRAM having a capacitance formed in accordance with the third preferred embodiment of this invention;

DESCRIPTION OF THE PREFERRED EMBODIMENTS

A detailed description of the present invention will now be made referring to the accompanying drawings.

FIGS. 2A to 2F depict the steps in the manufacture of a stacked capacitor of a semiconductor device in accordance with this invention.

Figure 1:
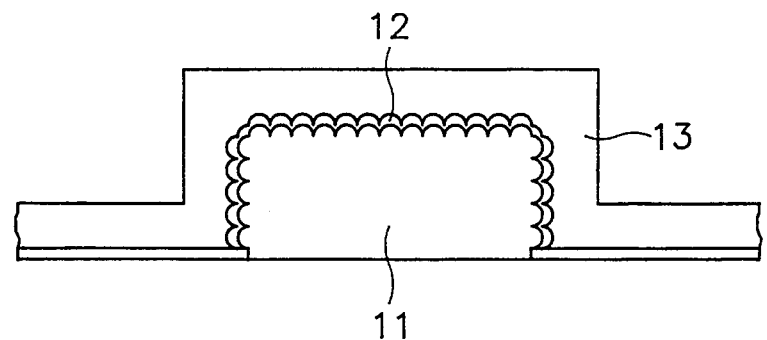
FIG. 1 is a sectional view of a known stacked capacitor type DRAM (Dynamic Random Access Memory)
Figure 2A:
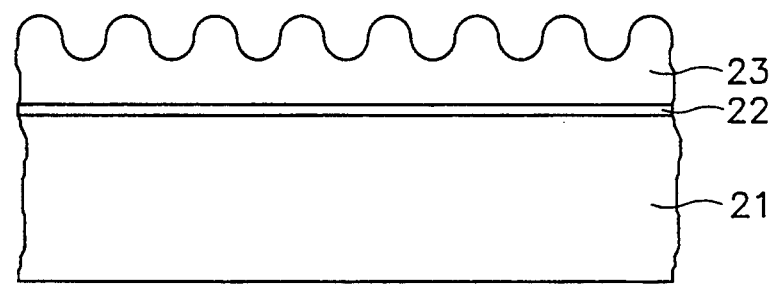
FIGS. 2A to 2F depict the steps in the manufacture of a capacitor of a semiconductor device in accordance with this invention.

In FIG. 2A, a first conductive layer 21 of capacitor is formed of a material chosen from among polysilicon, amorphous silicon, in-situ doped polysilicon or tungsten, and a nonconductive layer 22 is deposited on the substrate. A polysilicon layer 23 having a rough surface at about 540° C. to 600° C. is applied to the nonconductive layer 22.

Figure 2B:
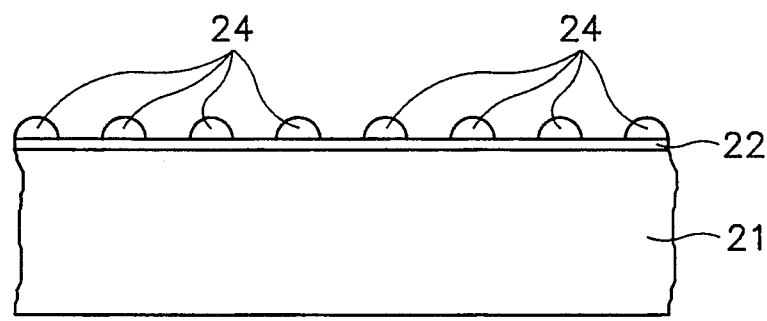

As shown in FIG. 2B, the polysilicon layer 23 having a rough surface is etch backed away by an anisotropic etching method to form polysilicons 24 of islandlike configuration. A dry-etching is used in this process. Once this polysilicon is applied to be islandlike from the beginning, the etch-back process can be omitted.

Figure 2C:
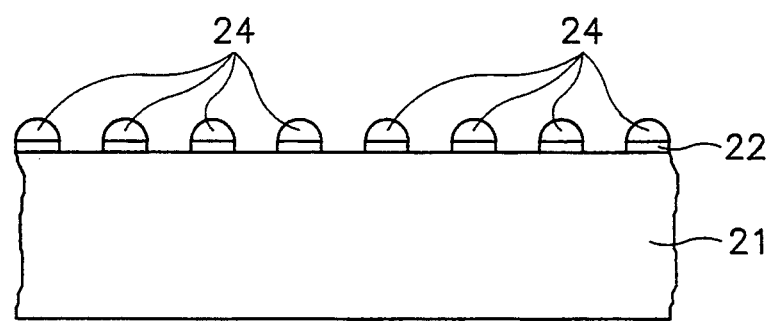

After that, using the polysilicons 24 as a mask, the nonconductive layer 22 is etched by an anisotropic dry-etching method (FIG. 2C).

Figure 2D:
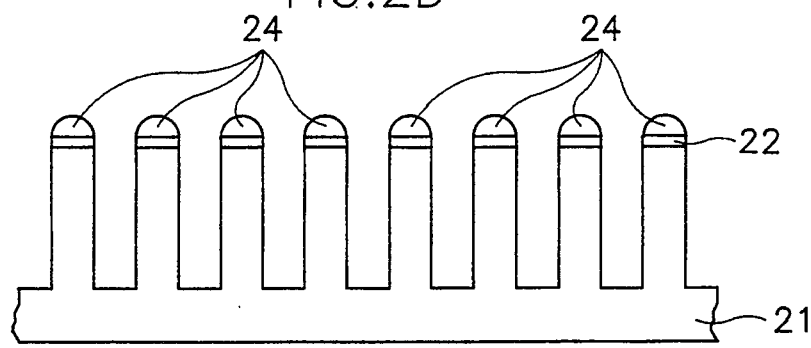

Referring now to FIG. 2D, the first conductive layer of capacitor is etched to a predetermined depth, more particularly, as deeply as 80%–90% of the thickness of the substrate, using the nonconductive layer 22 as an etch mask. It should be noted that the etching process is carried out not to expose the bottom of the base substrate. Furthermore, in the case where polysilicon is used for the formation of the first conductive layer 21 of the capacitor, the islandlike polysilicons are also etched when the first conductive layer 21 of capacitor is etched, and the nonconductive layer 22 is left alone.

Figure 2E:
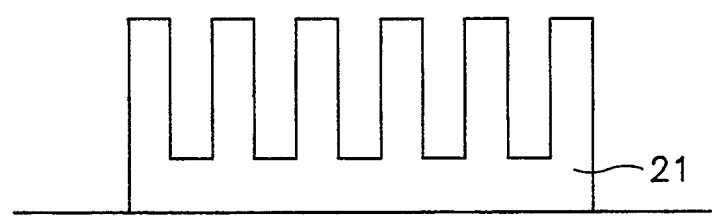

Subsequently, after the nonconductive layer 22 is removed, the first conductive layer 21 of capacitor is etched through a photo-etching, and then patterned as shown in FIG. 2E. Preferably, the surface of the substrate is not limited as the state shown in FIG. 2E but has a rough surface with trenchlike sections.

Figure 2F:
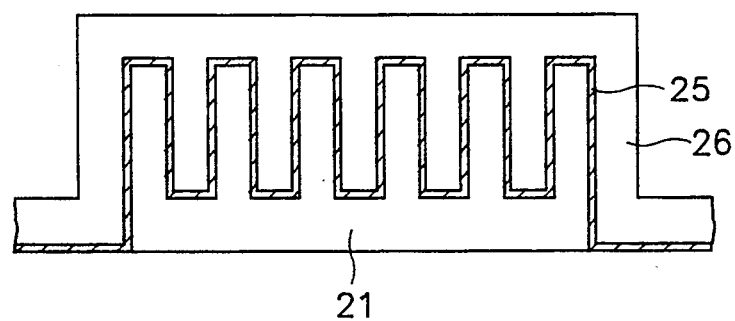

Finally, a capacitor dielectric film 25 is applied to the pattern of the base substrate, and a second conductive layer 26 of the capacitor is formed (FIG. 2F). Three layers of oxide/nitride/oxide film or two layers of nitride/oxide film are used as the capacitor dielectric film. Otherwise, a high dielectric film such as $Ta_2O_5$ can be also used. The second conductive layer of the capacitor is formed of polysilicon or in-situ doped polysilicon.

Since the capacitor formed as above can have a more increased area of capacitance than the one formed by a conventional art technology, satisfactory storage capacitance can be effectively secured.

Figure 3:
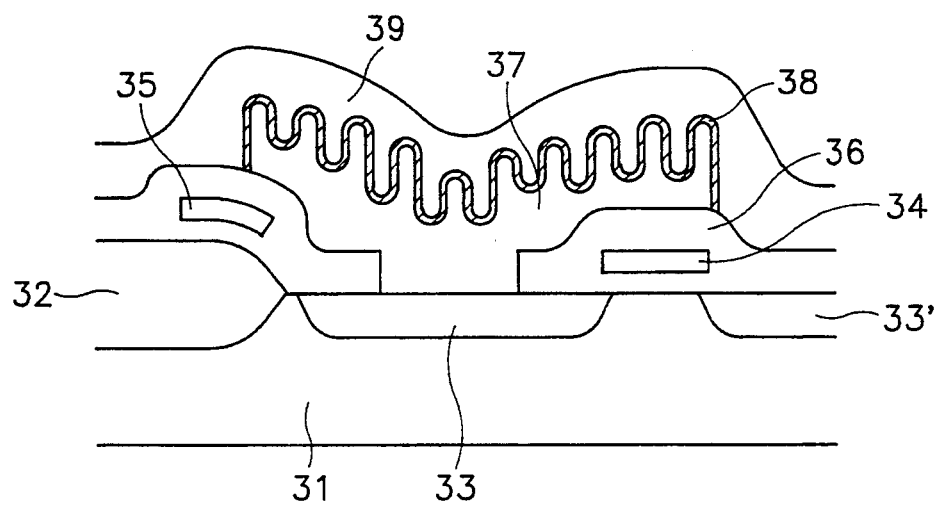
FIG. 3 depicts a first preferred embodiment of a semiconductor device formed by the method for manufacturing a capacitor in accordance with this invention.

FIG. 3 depicts a first preferred embodiment of a semiconductor device formed by the method for manufacturing a capacitor in accordance with this invention. First, a field oxide layer 32 is formed on a silicon substrate 31 to define an active region, and after a gate electrode 34 is formed of polysilicon, source/drain regions 33 and 33' are formed by ion implantation. The gate electrode 34 and the source/drain regions 33 and 33' form an access transistor of a semiconductor device. Reference numerals 36 and 35 designate an interlayer insulating film and a word line, respectively.

After that, a first conductive layer 37 of the capacitor is formed of trenchlike polysilicon, and a capacitor dielectric film 38 is formed. A plate electrode 39, a second conductive layer of capacitor, is formed of polysilicon.

FIGS. 4A to 4F depict the steps in the manufacture of a capacitor including an electrode substrate of a plurality of microscopic trenchlike sections in accordance with a second preferred embodiment of this invention.

As a second embodiment in the manufacture of a capacitor in accordance with the present invention, a polysilicon layer that becomes a first conductive layer is deposited to a thickness of 2000 to 4000 angstroms by means of a low pressure chemical vapor deposition process, and then doped with impurity. In this process, a single crystalline silicon doped with impurity can be utilized, instead of polysilicon doped with the impurity.

Figure 4A:
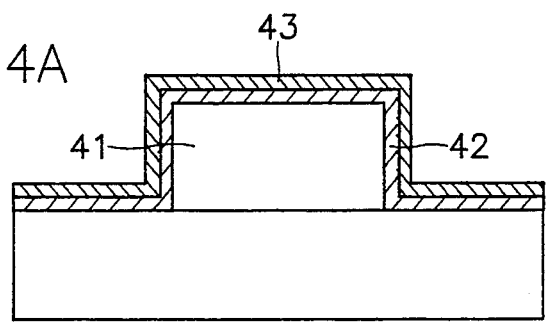
FIGS. 4A to 4F depict the steps in the manufacture of a capacitor including an electrode substrate of a plurality of microscopic trenchlike sections in accordance with a second preferred embodiment of this invention.

Subsequently, the polysilicon layer is etched, using a photoresist pattern, and a first conductive layer 41 is formed as shown in FIG. 4A. A first oxide film 42 is formed to a thickness of 50 to 2000 angstroms, and a silicon nitride film 43 is then formed thereon to a thickness of 30 to 500 angstroms.

Figure 4B:
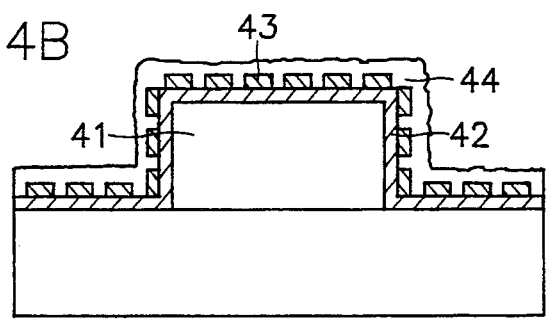

As shown in FIG. 4B, the silicon nitride film 43 is thermally oxidized to form a second oxide film 44 on the surface. Due to this oxidation process, pinholes are increased in the thin silicon nitride film 43, and silicon of the silicon nitride film is consumed at the time of the oxidation whereby new pinholes are created or the film is cracked partially.

Figure 4C:
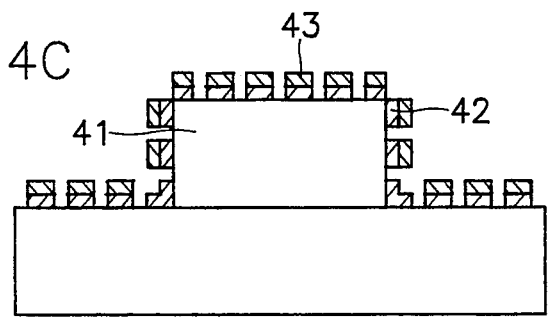

Referring now to FIG. 4C, the second oxide film 44 and the first oxide film 42 are removed by a wet-etching method to expose the silicon nitride film 43 and the first conductive layer, using the silicon nitride film 43 that is cracked or has pinholes as an etching mask such that undulated profiles made of the silicon nitride film 43 and oxide film 42 are created.

If the first conductive layer is etched through an anisotropic etching, using as a mask the remained silicon nitride film 43 and oxide film 42 passed through the process of FIG. 4C, trenches having uneven configurations are formed on a region where the silicon nitride film 43 and oxide film 42 are not formed. The depth of the trench is determined by controlling the etching time according to a predetermined capacitance of capacitor. And, since the anisotropic etching process has been carried out, these trenches are formed vertically just on the upper surface of the first conductive layer 41.

Figure 4D:
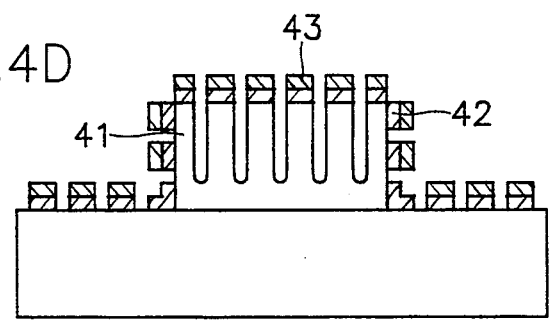
Figure 4D:
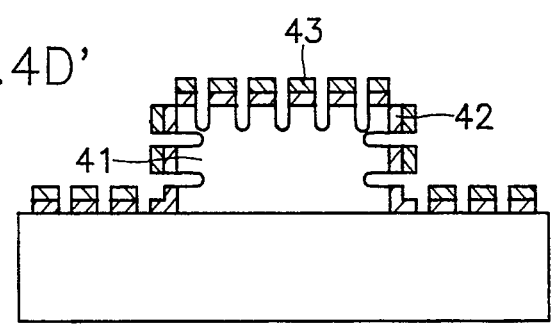
Figure 4E:
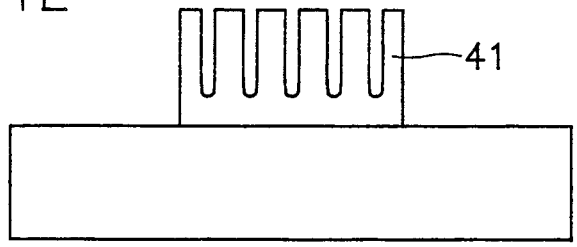
Figure 4E:
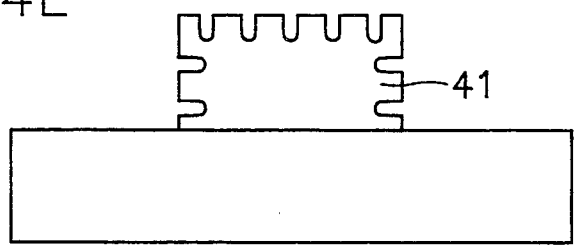

After the process of FIG. 4D, by etching the silicon nitride film 43 and oxide film 42 used as a mask in serial order through wet etching, just the first conductive layer 41 having a plurality of microscopic trenchlike sections are remained, as shown in FIG. 4E.

Figure 4F:
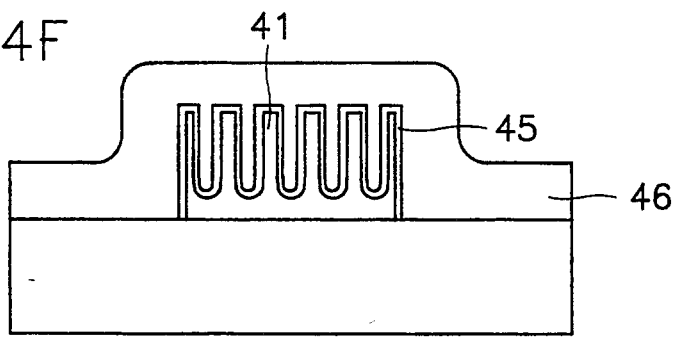
Figure 4F:
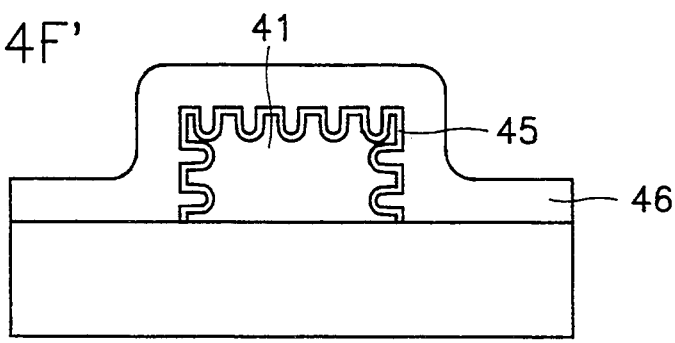

After the process of FIG. 4E, a dielectric film 45 is formed along the surface of the first conductive layer 41, and a second conductive layer 46 is formed thereon, whereby the capacitor in accordance with this invention is completely formed, as depicted in FIG. 4F. The dielectric film 45 is preferably formed of two layers of nitride and oxide film, three layers of oxide, nitride and oxide film, or high dielectric film such as $Ta_2O_5$. The second conductive layer 46 that is the upper substrate of the capacitor is formed of polysilicon doped with impurities or single crystalline silicon doped with impurities.

As a third preferred embodiment, in the manufacture of a capacitor of the present invention, the processes of FIGS. 4A to 4C in this embodiment are carried out equally to those of the second embodiment. After these processes, the first conductive layer is etched through isotropic etching, instead of the anisotropic one, using the remained silicon nitride film 43 and oxide film 42 as a mask. According to this isotropic etching, trenches are formed over the whole upper and side surfaces of the first conductive layer 41, as depicted in FIG. 4D'. The depth of the trench is determined by controlling the etching time according to a predetermined capacitance of capacitor.

After the process of FIG. 4D' by etching the silicon nitride film 43 and oxide film 42 used as a mask in serial order through wet etching, just the first conductive layer 41 having a plurality of microscopic trenchlike sections are remained, as shown in FIG. 4E'.

After the process of FIG. 4E', a dielectric film 45 is formed along the surface of the first conductive layer 41, and a second conductive layer 46 is formed thereon, whereby the capacitor in accordance with this invention is completely formed, as depicted in FIG. 4F'.

Accordingly, the capacitor in accordance with this invention has a first conductive layer having a plurality of microscopic trenchlike sections, and, thus, the surface area of the capacitor electrode is remarkably enhanced such that the sufficient capacitance of the capacitor is secured in the microscopic defined area and the margin of process becomes broad.

Figure 5A:
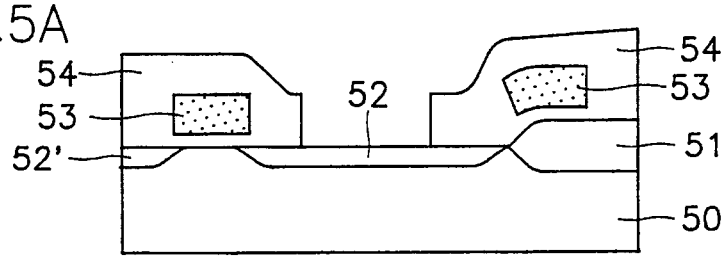
FIGS. 5A to 5G depict the steps in the manufacture of a DRAM having a capacitor formed in accordance with the second preferred embodiment of this invention.
Figure 5B:
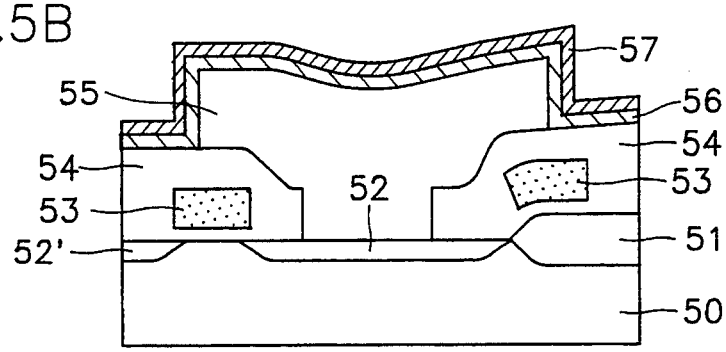
Figure 5C:
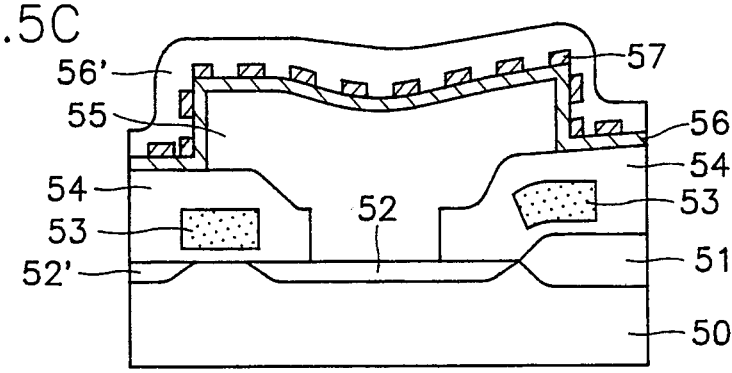
Figure 5D:
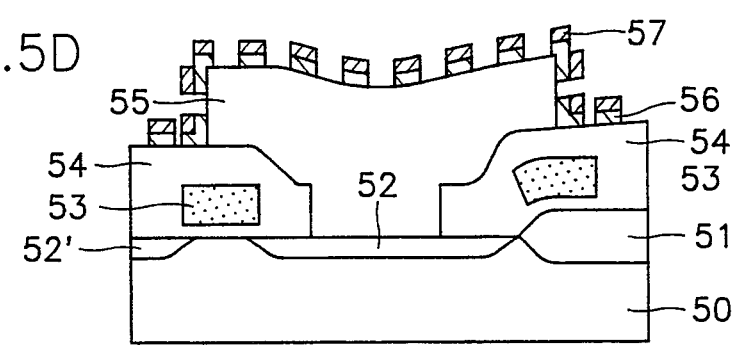
Figure 5E:
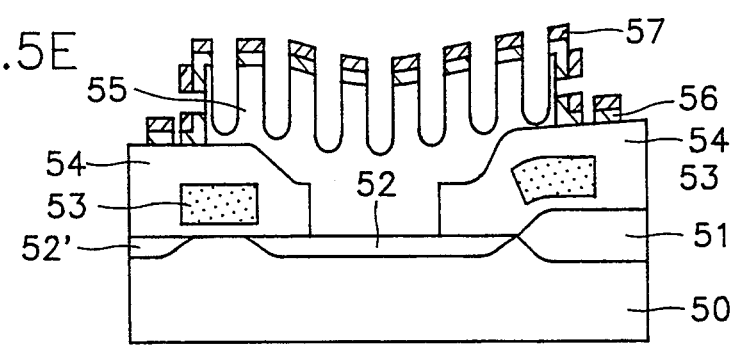
Figure 5E:
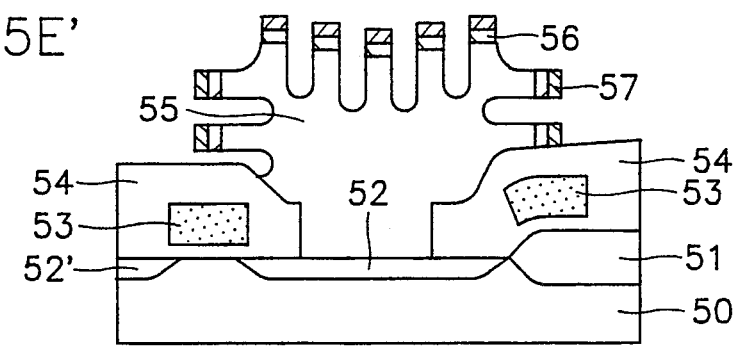

FIGS. 5A to 5G depict the steps in the manufacture of a DRAM having a capacitor formed in accordance with the second preferred embodiment of this invention, and FIGS. 5E' to 5G' depict partially the steps in the manufacture of a DRAM having a capacitance formed in accordance with the third preferred embodiment of this invention.

The manufacture of a DRAM having a capacitor according to a second preferred embodiment of this invention begins with defining an isolation region on a p-type semiconductor substrate 50 with a field oxide film 51. After gate electrodes 53 are formed, source/drain impurity regions 52 and 52' are formed. Insulating films 54 are formed, and the source region is then opened.

After that, referring to FIG. 5B, a polysilicon layer, a first conductive layer that serves as a storage electrode is deposited to a thickness of 2000 to 4000 angstroms thereon by the LPCVD process, and impurities are then doped. Single crystalline silicon doped with impurities can be used in this process. Subsequently, a first conductive layer 55 is formed by etching the polysilicon layer by means of the photoresist pattern, and a first oxide film 56 is formed to a thickness of 50 to 2000 angstroms thereon. On the first oxide film, a silicon nitride film 57 is formed to a thickness of 30 to 500 angstroms.

Referring now to FIG. 5C, a second oxide film 56' is formed by oxidizing the silicon nitride film 57. Due to the oxidation process, pinholes are increased in the thin silicon nitride film 43 and the silicon of the silicon nitride film is consumed, which results in the occurrence of new pinholes or cracks in the film.

AS shown in FIG. 5D, after the second oxide film 56' is removed by a wet etching process, the first oxide film 56 is etched using the silicon nitride film 57 having pinholes as an etching mask, and the undulated profiles comprising of the silicon nitride film 57 and oxide film 56 are then formed.

In FIG. 5E, where the first conductive layer placed underneath is etched by an anisotropic etching method, using as a mask the silicon nitride film 57 and oxide film 56 remained after the process of FIG. 5D, trenches are formed on a region where the silicon nitride film 57 and oxide film 56 are not formed. The depth of the trench is determined by controlling the etching time according to a predetermined capacitance of the capacitor.

And since the anisotropic etching was performed in the above process, these trenches are formed vertically just on the first conductive layer 55.

Figure 5F:
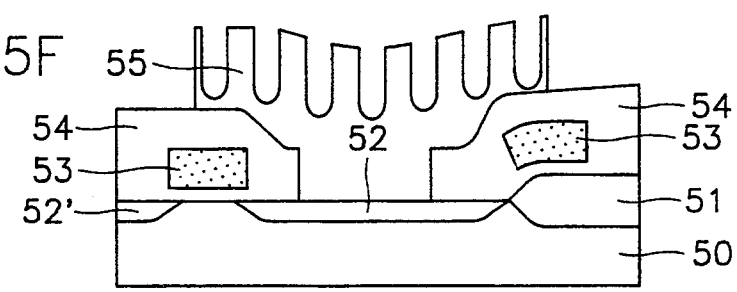
Figure 5F:
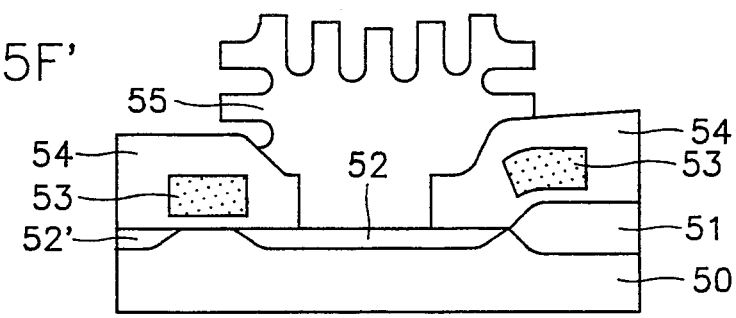

After the process of FIG. 5E, by removing the silicon nitride film 57 and oxide film 56 used as a mask in serial order through wet etching, just the first conductive layer 55 having a plurality of microscopic trenchlike sections are remained, as shown in FIG. 5F.

Figure 5G:
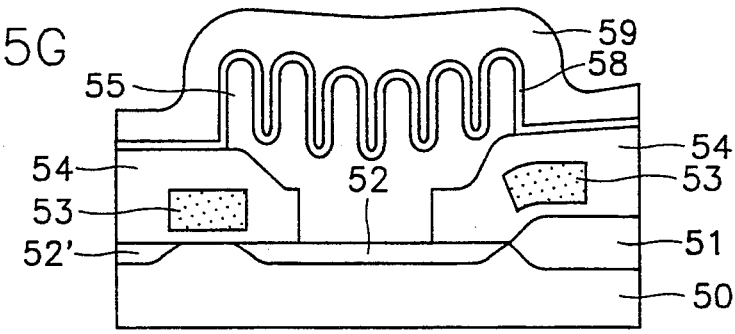
Figure 5G:
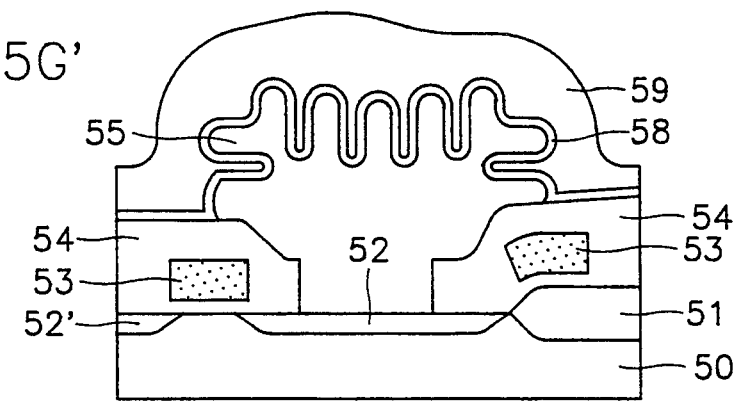

After the process of FIG. 5F, a dielectric film 58 is formed along the surface of the first conductive layer 55, and a second conductive layer 59 is formed thereon thereby forming a semiconductor device having the capacitor according to the second embodiment of this invention, as shown in FIG. 5G. The dielectric film 58 is preferably formed of two layers comprising of nitride and oxide film, three layers comprising of oxide, nitride and oxide film, or a high dielectric film such as $Ta_2O_5$.

The second conductive layer 59 that is a second conductive layer of the capacitor is formed of polysilicon doped with impurities or single crystalline silicon doped with impurities.

In the manufacture of a DRAM having a capacitor in accordance with a third embodiment of this invention, the processes depicted in FIG. 5A to FIG. 5D are carried out in this embodiment, equally to those of the second embodiment.

When it comes to the performance of a process for etching the first conductive layer placed underneath, using the remained silicon nitride film 57 and oxide film 56 as a mask, an isotropic etching method is used instead of the anisotropic etching one. According to this isotropic etching method, trenches are formed on the whole upper and side surfaces of the first conductive layer 55, as depicted in FIG. 5E'.

The depth of the trench is determined by controlling the etching time according to a predetermined capacitance of the capacitor.

After the process of FIG. 5E' the silicon nitride film 57 and oxide film 56 that were used as a mask are removed in serial order by a wet etching process, and just the first conductive layer 55 having a plurality of microscopic trenchlike sections on its whole upper and side surfaces is remained, as shown in FIG. 5F'.

Figure 6A:
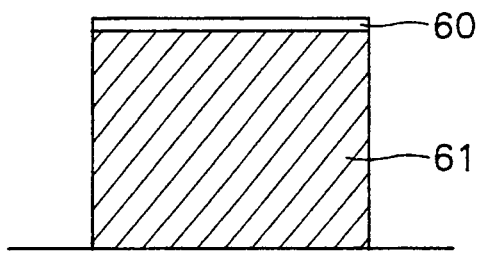
FIGS. 6A to 6F depict the steps in the manufacture of a capacitor including an electrode substrate of a plurality of microscopic trenchlike sections in accordance with this invention.

After the process of FIG. 5F' the dielectric film 58 is formed along the surface of the first conductive layer 55, and a second conductive layer 59 is formed on the dielectric film 58 thereby completing the capacitor in accordance with the third embodiment as depicted in FIG. 5G'. As another embodiment, the manufacture of a capacitor in accordance with this invention begins with depositing polysilicon layer that becomes a first conductive layer to a thickness of 2000 to 10000 angstroms. And then, impurities are doped. In this process, single crystalline silicon may be used, except polysilicon layer. Subsequently, a first oxide film 60 is formed to a thickness of 50 to 2000 angstroms thereon, and by forming and etching a predetermined photoresist pattern, a first conductive substrate 61 is formed, as depicted in FIG. 6A.

Figure 6B:
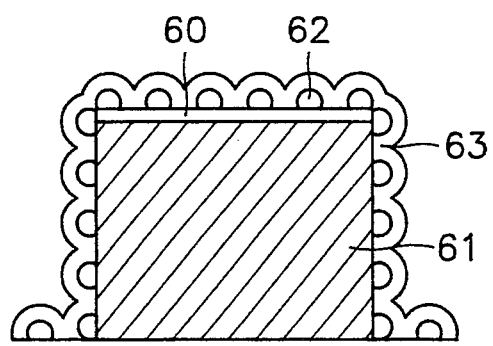

After that, as shown in FIG. 6B, polysilicon or single crystalline silicon is deposited to a thickness of 50 to 10000 angstroms at about 540° to 600° C., and there is formed a polysilicon layer (or single crystalline silicon layer), i.e. a hemispherical shaped grain (HSG) layer 62 having a rough surface. And, it is preferable that the polysilicon layer with a rough surface is a little etched selectively. Since the spaces between each grains, the opened areas where trenches are formed, become more increased according to this etching process, electrode areas of the trenches are more enhanced. After the HSG layer 62 is formed in this way, a second oxide film 63 is formed to a thickness of several tens or hundreds angstroms all over the HSG layer 62. Except the process that is depicted at the time of forming the HSG layer 62, the deposition of the polysilicon layer may be prior to the thermal treatment thereof that is carried out at 540° C. to 600° C.

Figure 6C:
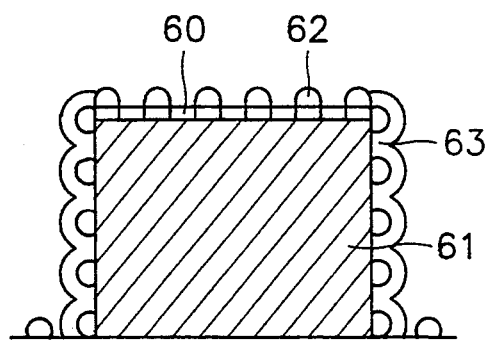

Subsequently, as shown in FIG. 6C, just the upper surface of the second oxide film 63 is etched by anisotropic etching in order that the side walls of the second oxide film 63 are remained. Using the HSG layer 62 as a mask, the first oxide film 60 is etched through anisotropic etching in order that the first conductive substrate 61 is exposed, and so the oxide film 60 has opened areas where microscopic trenches are formed.

Figure 6D:
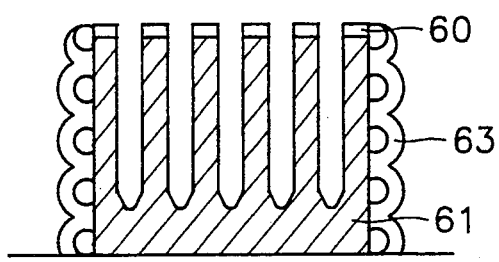

After that, using the oxide film 60 as a mask, the exposed first conductive substrate 61 is etched through anisotropic etching, as shown in FIG. 6D. In accordance with this anisotropic etching, from the first conductive substrate 61, grooves having trenchlike sections are formed vertically on the region where the oxide film is not formed, and the depth of these trenchlike grooves is determined by controlling the etching time in accordance with a predetermined capacitance of the capacitor.

Figure 6E:
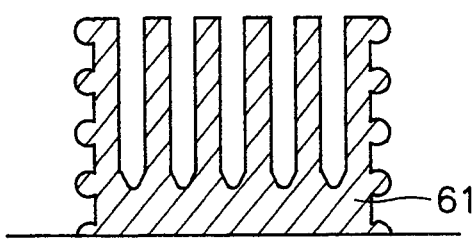

Referring now to FIG. 6E, by removing the oxide film 60, a plurality of trenchlike grooves is formed on the upper surface of the substrate and just the first conductive substrate 61 having undulated side walls is remained.

Figure 6F:
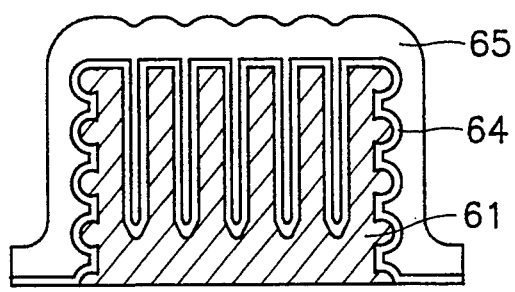

After that, a dielectric film 64 is formed along the surface of the first conductive layer, and a second conductive layer 65 is formed thereon, thereby completing the formation of the capacitor according to the present invention, as shown in FIG. 6F. The dielectric film 64 is preferably formed of two layers comprising of nitride and oxide film, three layers comprising of oxide, nitride and oxide film, or a high dielectric film such as $Ta_2O_5$. The second conductive layer 65 that is a second conductive layer of the capacitor is formed of polysilicon doped with impurities or single crystalline silicon doped with impurities.

Accordingly, the capacitor in accordance with this invention has an electrode substrate having a plurality of microscopic trenchlike sections, and, thus, the surface area of the capacitor electrode is remarkably enhanced such that the sufficient capacitance of the capacitor is secured in the microscopic defined area and the margin of process becomes broad.

Figure 7A:
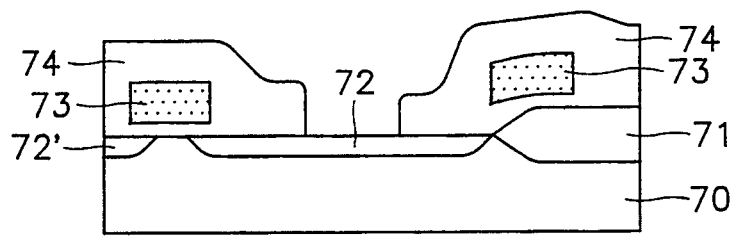
FIGS. 7A to 7G depict the steps in the manufacture of a DRAM having a capacitor including an electrode substrate of a plurality of microscopic trenchlike sections in accordance with this invention.

As another preferred embodiment in FIG. 7A, the manufacture of a semiconductor device having a capacitor according to this invention begins with defining an isolation region with a field oxide film 71 on a p-type semiconductor substrate 70. After gate electrodes 73 are formed, source/drain impurity regions 72 and 72' are formed through a doping method. An insulating film 74 is formed and the source region is opened.

Figure 7B:
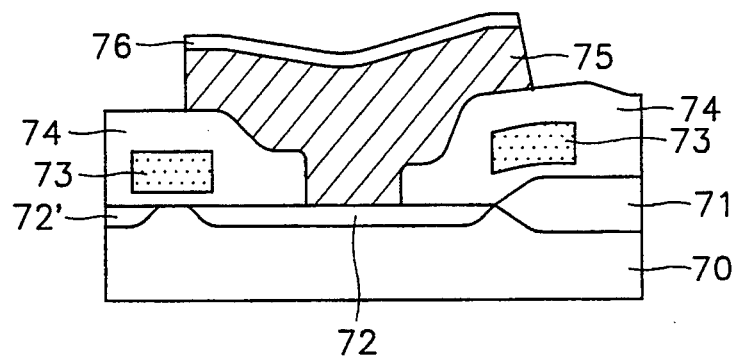
Figure 7C:
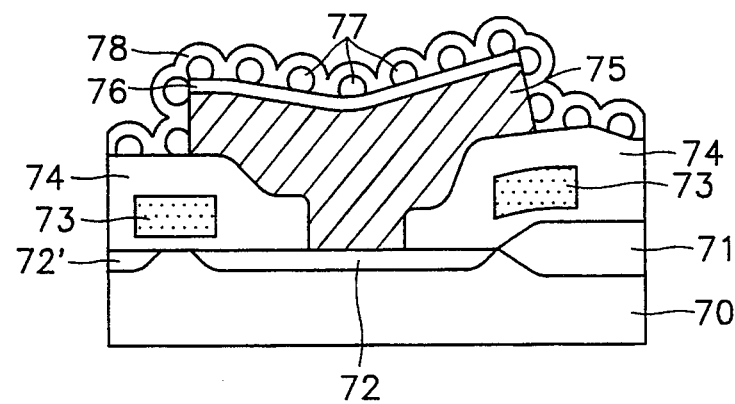

As shown in FIG. 7B, a first conductive layer 75, a polysilicon layer is deposited, as a storage electrode, to a thickness of 2000 to 4000 angstroms, and impurities are doped. Single crystalline silicon may be used in this process, instead of polysilicon. And then, a first oxide film 76 is formed to a thickness of 50 to 2000 angstroms thereon, and by forming and etching a predetermined photoresist pattern, the first conductive substrate 75 is formed as depicted in FIG. 7A.

After that, polysilicon or single crystalline silicon is deposited to a thickness of 50 to 10000 angstroms at 540° to 600° C. and a polysilicon (or single silicon) layer having a rough surface, i.e. a HSG layer 77 is formed. It is preferable that the polysilicon layer is a little etched selectively.

Since the spaces between each grains, the opened areas where trenches are formed, become more increased according to this etching process, electrode areas of the trenches are more enhanced. After the HSG layer 77 is formed in this way, a second oxide film 78 is formed to a thickness of several tens or hundreds angstroms all over the HSG layer 77. Except the process that is depicted at the time of forming the HSG layer 77, the deposition of the polysilicon layer may be prior to the thermal treatment thereof that is carried out at 540° C. to 600° C.

Figure 7D:
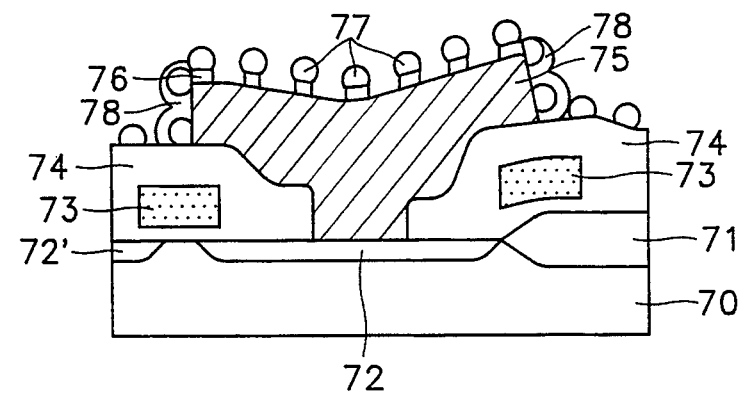

Subsequently, as shown in FIG. 7D just the upper surface of the second oxide film 78 is etched by anisotropic etching in order that the side walls of the second oxide film 78 are remained. Using the HSG layer 77 as a mask, the first oxide film 76 is etched through anisotropic etching in order that the first conductive substrate 75 is exposed, and so the oxide film 76 has opened areas where microscopic trenches are formed.

Figure 7E:
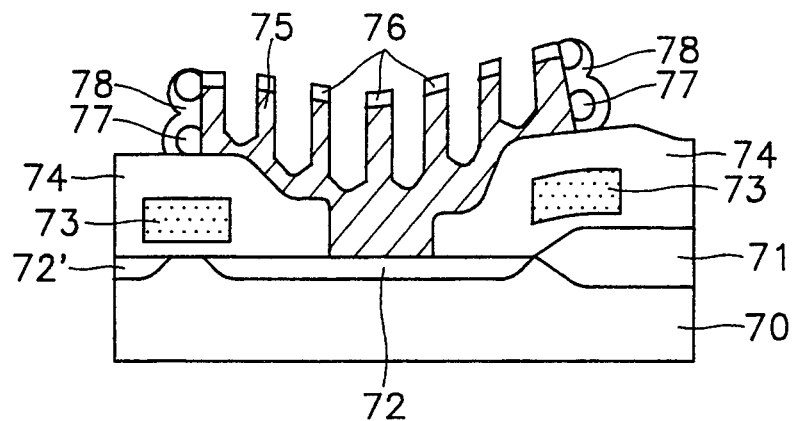

After that, using the oxide film 76 as a mask, the exposed first conductive substrate 75 is etched through anisotropic etching, as shown in FIG. 7E. In accordance with this anisotropic etching, from the first conductive substrate 75, grooves having trenchlike sections are formed vertically on the region where the oxide film is not formed, and the depth of these trenchlike grooves is determined by controlling the etching time in accordance with a predetermined capacitance of the capacitor.

Figure 7F:
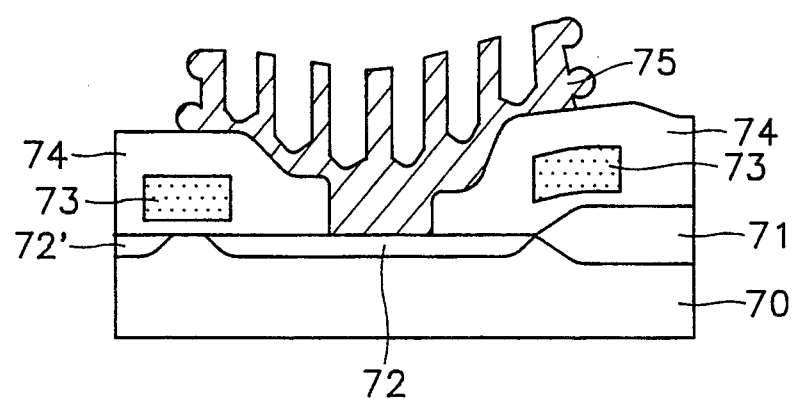

Referring now to FIG. 7F, by removing the oxide films 76 and 78, a plurality of trenchlike grooves is formed on the upper surface of the substrate and just the first conductive substrate 75 having undulated side walls is remained.

Figure 7G:
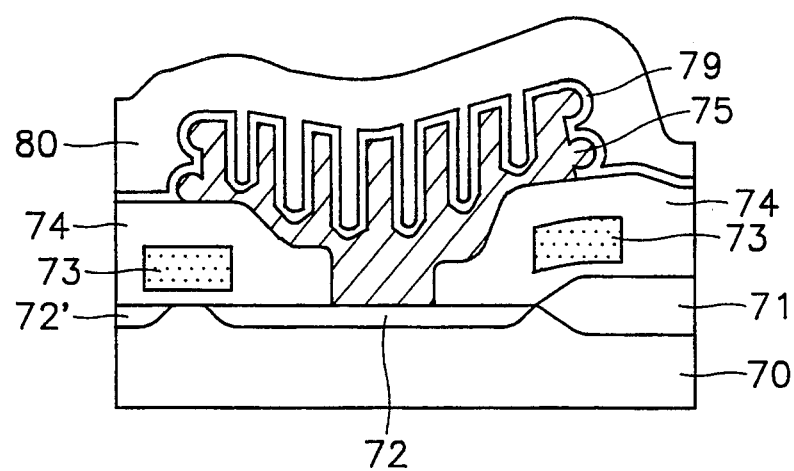

After that, a dielectric film 79 is formed along the surface of the first conductive layer 75, and a second conductive layer 80 is formed thereon, thereby completing the formation of the capacitor according to the present invention, as shown in FIG. 7G. The dielectric film 79 is preferably formed of two layers comprising of nitride and oxide film, three layers comprising of oxide, nitride and oxide film, or a high dielectric film such as $Ta_2O_5$. The second conductive layer that is a plate electrode of the capacitor is formed of polysilicon doped with impurities or single crystalline silicon doped with impurities.

Finally, the semiconductor device having the capacitor in accordance with this invention is formed.

As can be seen from the above preferred embodiment, in the manufacture of a capacitor, the case where trenches are formed deeply not to expose the bottom of the base substrate of the capacitor and the surface area of the capacitor is then enhanced, can have an increased capacitance more than the case where a storage electrode is formed of polysilicon having a rough surface.

The method for making a capacitor in accordance with this invention is applied to stack/trench capacitors or trench ones and a structure of trenchlike sections as well as stacked capacitors.

In conclusion, according to the advantages of this invention, since a storage electrode is formed of combination of countless trenchlike sections compared to a capacitor made by a conventional method, the surface area of the storage electrode can be enhanced, and if an etch rate is controlled at the time of etching the storage electrode, using an oxide film as a mask, a predetermined capacitance can be controlled.

Furthermore, the capacitor of this invention has an electrode substrate of a plurality of microscopic trenchlike sections, and therefore, the surface area of the capacitor electrode is remarkably enhanced such that the sufficient capacitance of the capacitor is secured in the microscopic defined area and the margin of process becomes broad, whereby the integrity of DRAMs is more improved.

What is claimed is:

1. A method for making a capacitor, comprising the steps of:

forming a first conductive layer on a major surface of a substrate;

patterning said first conductive layer, to thereby form a first patterned layer;

forming a first oxide film on said first patterned layer and exposed portions of said major surface of said substrate;

forming a silicon nitride film on said first oxide film;

oxidizing said silicon nitride film, to thereby form a second oxide film;

wherein a plurality of pinholes are formed in said silicon nitride film during said oxidizing step, to thereby form a second patterned layer;

removing said second oxide film and exposed portions of said first oxide film:

etching said first conductive layer, using said second patterned layer as a mask, to thereby form a plurality of microscopic trenches in said first conductive layer;

removing remaining portions of said first oxide film and said second patterned layer; and, forming a dielectric film on said first patterned layer; and, forming a second conductive layer on said dielectric film.

2. The method as set forth in claim 1, wherein said first conductive layer is a material selected from a group consisting of polysilicon doped with impurities and monocrystalline silicon doped with impurities.

3. The method as set forth in claim 2, wherein said first conductive layer has a thickness of 2000 to 4000 angstroms.

4. The method as set forth in claim 3, wherein said first oxide film has a thickness of 50 to 2000 angstroms.

5. The method as set forth in claim 4, wherein said silicon nitride film has a thickness of 30 to 500 angstroms.

6. The method as set forth in claim 1, wherein said step of etching said first conductive layer is carried out by means of an anisotropic ethcing process.

7. The method as set forth in claim 1, wherein said second conductive layer is a material selected from a group consisting of polysilicon doped with impurities and monocrystalline silicon doped with impurities.

8. The method as set forth in claim 1, wherein said dielectric film is comprised of a plurality of individual layers laminated together.

* * * * *